United States Patent
Tsai

(10) Patent No.: US 7,356,433 B2
(45) Date of Patent: Apr. 8, 2008

(54) APPARATUS OF AUTOMATICALLY DETECTING TYPE OF CABLE CONNECTED TO NETWORK AND METHOD THEREOF

(75) Inventor: Wei-Hung Tsai, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 0 days.

(21) Appl. No.: 11/607,912

(22) Filed: Dec. 4, 2006

(65) Prior Publication Data

US 2007/0078619 A1 Apr. 5, 2007

Related U.S. Application Data

(62) Division of application No. 11/046,848, filed on Feb. 1, 2005.

(51) Int. Cl.
*G01R 27/28* (2006.01)
*G01M 19/00* (2006.01)
(52) U.S. Cl. ............. 702/117; 702/122; 702/182; 702/183; 702/186; 370/389
(58) Field of Classification Search ............ 702/122; 370/389
See application file for complete search history.

(56) References Cited

U.S. PATENT DOCUMENTS

2005/0249203 A1* 11/2005 Huang ................. 370/389

* cited by examiner

*Primary Examiner*—John Barlow
*Assistant Examiner*—Sujoy Kundu
(74) *Attorney, Agent, or Firm*—WPAT, P.C.; Justin I. King

(57) ABSTRACT

The present invention is to provide an apparatus of automatically detecting the type of a cable connected to a network and method thereof, which comprising a memory having an automatic detection program, a switch, a network controller adapted to switch the state of the switch based on a predetermined switching order stored in the automatic detection program, a port having its state being detected by the network controller such that the automatic detection program is able to know the type of a compatible cable by connecting a connector at one end of the cable to the port, and a plurality of transmission interfaces interconnected the network controller and the switch wherein the network apparatus is adapted to receive network signals transmitted from the cable and maintain a connecting state of one transmission interface.

11 Claims, 2 Drawing Sheets

APPARATUS OF AUTOMATICALLY DETECTING TYPE OF CABLE CONNECTED TO NETWORK AND METHOD THEREOF

CROSS-REFERENCE TO RELATED APPLICATION

This application is a divisional application of application Ser. No. 11/046,848, filed Feb. 1, 2005.

FIELD OF THE INVENTION

The present invention relates to determination of the type of cable connected to network and more particularly to an apparatus capable of automatically detecting the type of such cable and method thereof.

BACKGROUND OF THE INVENTION

Conventionally, network is employed as means for data communication among computers. Among types of network, Ethernet is the most popular local area network. As to connectors and cables employed by Ethernet, there are a number of types as follows. First one is RJ-45 connector and a cable connected thereto is an unshielded twisted pair (UTP). Second one is BNC connector and a cable connected thereto is BNC coaxial cable. Third one is an optical fiber connector and a cable connected thereto is a bundle of optical fibers. Fourth one is AUI connector and a cable connected thereto is a thick coaxial cable for signal transmission. Further, a serial connector is provided on a network apparatus for managing and configuring the network apparatus and a cable connected thereto is a coaxial cable. Alternatively, the serial connector is replaced by a RJ-45 connector and a cable connected thereto is a UTP for managing the network apparatus.

Typically, only a connector compatible with one cable is provided for managing a network apparatus. A connector compatible with two types of cable may be provided in some cases. Rarely, for example being requested by customers, a connector compatible with three types of cable may be provided for user selection. Moreover, the cable is selected in advance prior to connecting to the network apparatus. Also, a port is provided on the network apparatus for being compatible with the cable. The port is adapted to only receive signal transmitted from the cable connected to the network. In other words, it is impossible of connecting the port to one of two different types of cable for the network apparatus. As such, the network apparatus is not able to automatically switch to connect to a compatible cable. For example, in a case of a RJ-45 connector formed at one end of coaxial cable used as transmission medium, the network apparatus does not have a compatible port to connect to the connector. As such, a connection to the cable connected to the network is made impossible. This does not meet the needs of users. Thus, a need for improvement exists.

SUMMARY OF THE INVENTION

After considerable research and experimentation, an apparatus of automatically detecting type of cable connected to a network and method thereof according to the present invention has been devised so as to overcome the above drawback of the prior art.

It is an object of the present invention to provide a method of automatically detecting the type of a cable connected to a network, the method implemented in a network apparatus comprising a memory having an automatic detection program, a switch, a network controller adapted to switch the state of the switch based on a predetermined switching order stored in the automatic detection program, a port having its state being detected by the network controller such that the automatic detection program is able to know the type of a compatible cable by connecting a connector at one end of the cable to the port, and a plurality of transmission interfaces interconnected the network controller and the switch wherein the network apparatus is adapted to receive network signals transmitted from the cable and maintain a connecting state of one transmission interface. By utilizing this method, a correct signal transmission by means of a correct connection is carried out.

It is another object of the present invention to provide an apparatus of automatically detecting the type of a cable connected to a network, comprising a plurality of transmission interfaces provided in a network apparatus; a port provided on a surface of the network apparatus; a switch provided between the port and the transmission interfaces; a memory provided in the network apparatus and having an automatic detection program; and a network controller provided in the network apparatus wherein in response to activating the network apparatus, the network controller is adapted to detect a network signal transmitted from the port connected to the connector at one end of the cable by running the automatic detection program, if the network signal is to be processed by one transmission interface connected to the switch the switch will not be switched, and the transmission interface is adapted to continuously process the network signal transmitted from the port via the connected connector.

The above and other objects, features and advantages of the present invention will become apparent from the following detailed description taken with the accompanying drawings.

DETAILED DESCRIPTION OF THE PREFERRED EMBODIMENTS

Figure 1:
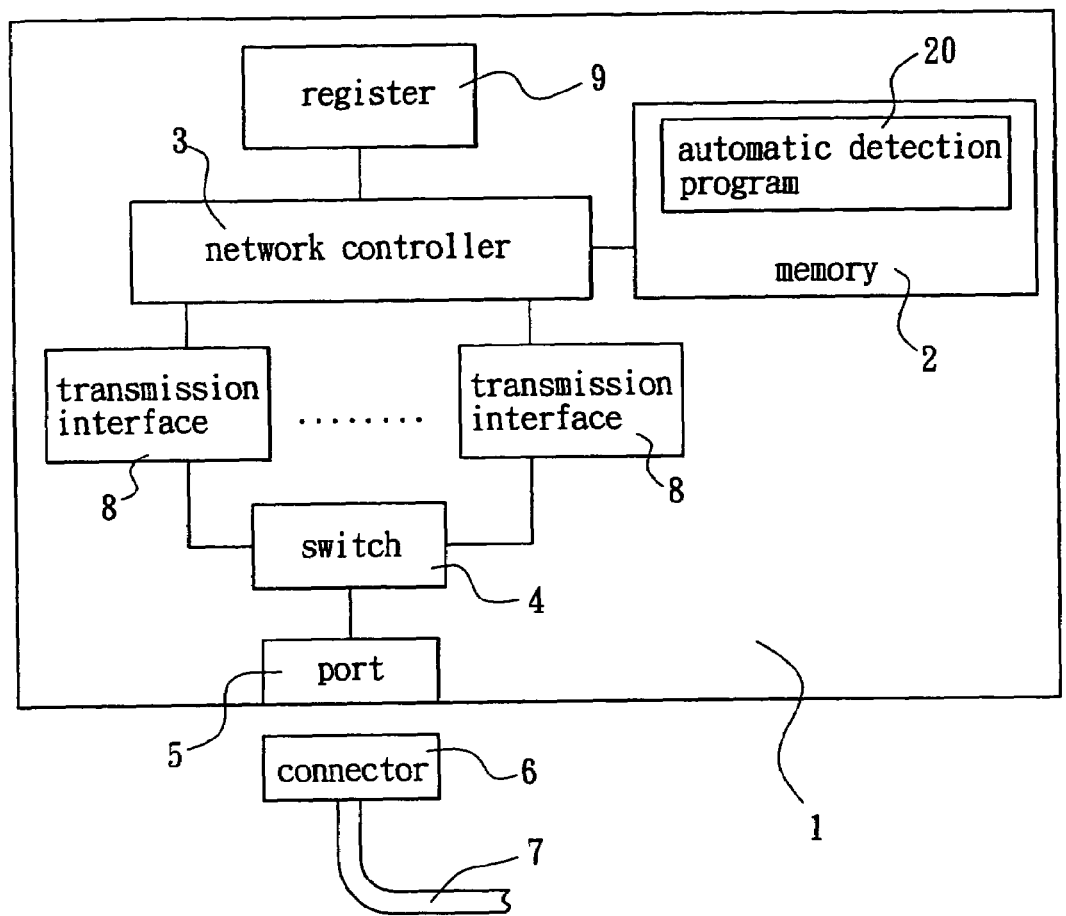
FIG. 1 is a block diagram of an apparatus according to the invention.

Referring to FIG. 1, there is shown a method of automatically detecting type of cable according to the invention. The method is implemented in a network apparatus 1 comprising a memory 2 having an automatic detection program 20, a switch 4, a network controller 3 adapted to switch the state of the switch 4 in accordance with a predetermined switching order stored in the automatic detection program 20, and a port 5 having its state being detected by the network controller 3 such that the automatic detection program 20 is able to know the type of a compatible cable 7 by connecting a connector 6 at one end of the cable 7 to the port 5. Moreover, a plurality of transmission interfaces 8 interconnected the network controller 3 and the switch 4 are able to transmit signals from the cable 7 to the network controller 3 (i.e., the network apparatus 1). As a result, a correct signal transmission by means of a correct connection is effected.

Figure 2:
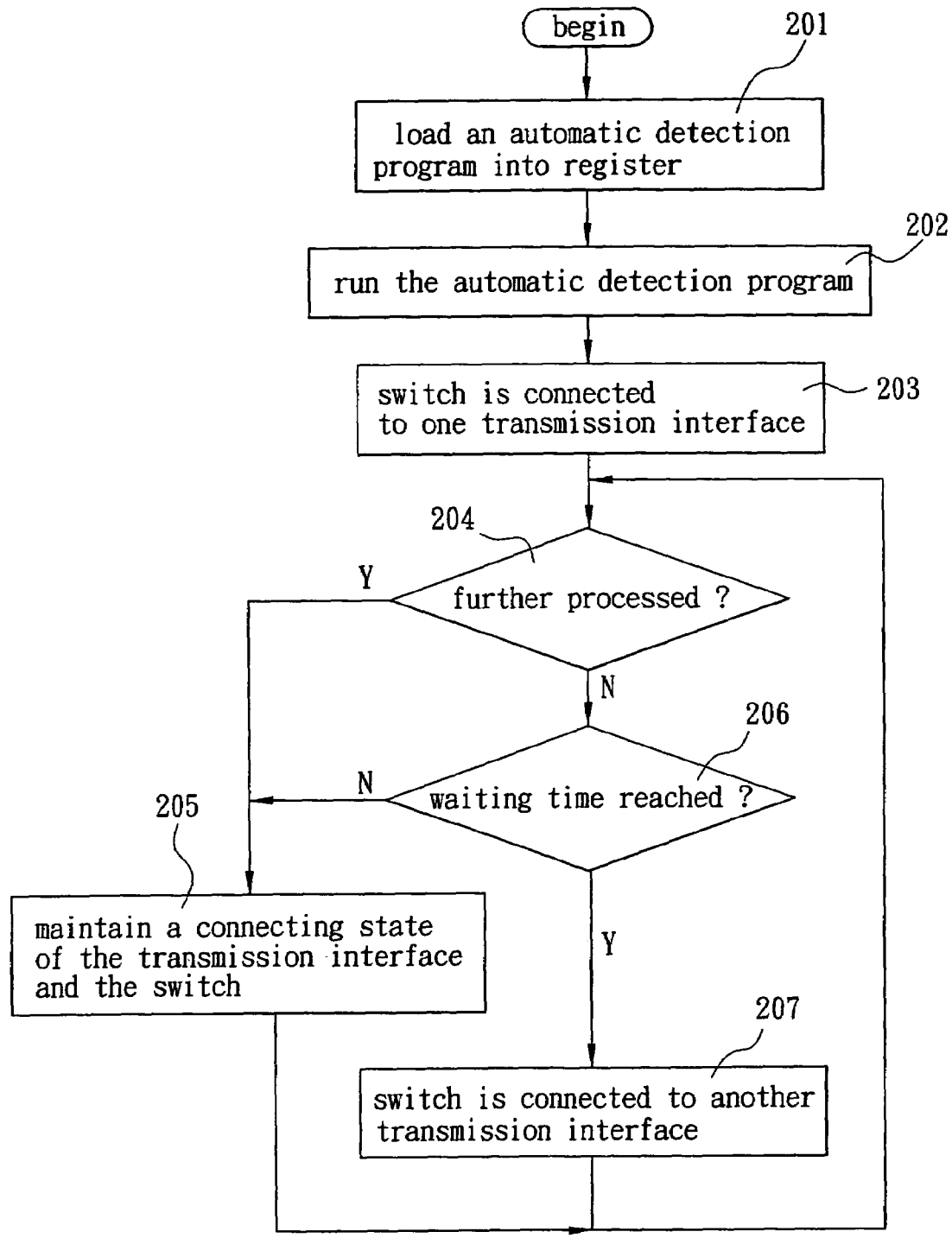
FIG. 2 is a flow chart illustrating a process according to the invention.

Referring to FIG. 2, it illustrates a process of automatically detecting the transmission interfaces 8 by the network apparatus 1 according to the invention. The process comprises the following steps:

In step 201, first load the automatic detection program 20 into a register 9 in the network apparatus 1.

In step 202, run the automatic detection program 20 to access the transmission interfaces 8 by means of the register 9 such that the network apparatus 1 is able to set the transmission interfaces 8 sequentially.

In step 203, the network controller 3 is commanded by the running automatic detection program 20 to cause the switch 4 to connect to one of the transmission interfaces 8 in a best mode of carrying out the invention.

In step 204, send a signal containing the current state of the port 5 to the register 9. The network controller 3 is thus able to determine whether the signal is to be processed by the transmission interface 8 connected to the switch 4 by analyzing the signal transmitted to the register 9 in which the signal is transmitted from the cable 7 connected to a network by connecting the port 5 to the connector 6. If yes, the process goes to step 205. Otherwise, the process jumps to step 206.

In step 205, the network controller 3 maintains the connecting state of the transmission interface 8 and the switch 4 so as to receive signal from the cable 7 connected to a network. Next, the process loops back to step 204.

In step 206, the network controller 3 determines that the signal is not to be processed by the transmission interface 8 connected to the switch 4 by analyzing the signal transmitted to the register 9 in which the signal is transmitted from the cable 7 connected to a network by connecting the port 5 to the connector 6. Next, it is determined whether a predetermined period of waiting time set by the automatic detection program 20 has been reached. If yes, the process goes to step 207. Otherwise, the process jumps to step 205.

In step 207, the network controller 3 is commanded by the running automatic detection program 20 to cause the switch 4 to connect to another one of the transmission interfaces 8 prior to looping back to step 204.

By performing the above steps, the network controller 3 is adapted to detect signal transmitted from the port 5 via the cable 7 connected to a network by sequentially switching the switch 4 to each one of the transmission interfaces 8 in order to determines whether the signal is to be processed by the transmission interface 8 connected to the switch 4. In such a manner, the network apparatus 1 is able to receive signal transmitted from one of a plurality of different types of cable 7 connected to a network by connecting the port 5 to the connector 6 at one end of the cable 7. As an end, the purposes of transmitting signal over a network and network management can be obtained.

Referring to FIG. 1 again, in the network apparatus 1 of automatically detecting type of cable according to the invention there are provided a network controller 3 and a plurality of transmission interfaces 8. A port 5 is provided on a surface of the network apparatus 1. A switch 4 is provided between the port 5 and the transmission interfaces 8. A memory 2 having an automatic detection program 20 is provided in the network apparatus 1. After activating the network apparatus 1, the network controller 3 is adapted to detect signal transmitted from the port 5 connected to the connector 6 by running the automatic detection program 20 in which the connector 6 is provided at one end of cable 7 connected to a network. If the signal is to be processed by the transmission interface 8 after determination the switch 4 will not be switched. As such, the transmission interface 8 connected to the switch 4 may continuously process network signal transmitted from the port 5 via the connected connector 6.

In the invention after activating the network apparatus 1, the network controller 3 is adapted to detect signal transmitted from the port 5 connected to the connector 6 by running the automatic detection program 20 in which the connector 6 is provided at one end of cable 7 connected to a network. If the signal is not to be processed by the transmission interface 8 after determination the switch 4 will be switched to connect to another one of the transmission interfaces 8. As such, it is possible of determining whether the port 5 is receiving signal transmitted from the port 5 via the connected connector 6 provided at one end of another type of cable with the switch 4 interconnected the port 5 and another transmission interface 8.

A preferred embodiment of the invention is described below for illustrating a practical operation.

In the embodiment, each of the transmission interfaces 8 in the network apparatus 1 is implemented as a combination of Ethernet interface circuit and Universal Asynchronous Receiver Transmitter (UART) interface circuit. The switch 4 is implemented as a relay. The port 5 is implemented as a RJ-45 port. In a case of the connector 6 implemented as a RJ-45 connector, the cable 7 extended from the connector 6 implemented as a UTP, and the relay connected to the Ethernet interface circuit, the port 5 is electrically connected to the Ethernet interface circuit via the relay for transmitting network signal. Otherwise, it is determined that the relay is not electrically connected to the Ethernet interface circuit but electrically connected to the UART interface circuit. In this case a predetermined period of waiting time has to be elapsed. Thereafter, cause the relay to switch to electrically connect to the Ethernet interface circuit. As a result, network signal can be transmitted to the network apparatus 1 via the port 5 since the relay is electrically connected to the Ethernet interface circuit.

Alternatively, one end of the connector 6 is implemented as a RJ-45 connector and the other end thereof is implemented as a D-connector. That is, the connector 6 is an adapter in which the D-connector is adapted to connect to a mated D-connector and which is connected to a serial cable. At this time, in a case of the relay electrically connected to the Ethernet interface circuit network signal cannot be transmitted to the port 5. In this case a predetermined period of waiting time has to be elapsed. Thereafter, cause the relay to switch to electrically connect to the UART interface circuit. As a result, network signal can be transmitted to the network apparatus 1 via the port 5 since the relay is electrically connected to the UART interface circuit.

In view of the above, it is understood that characteristics of the method and the apparatus of the invention are that the automatic detection program 20 is embedded in the network apparatus 1, run the automatic detection program 20 to set the transmission interfaces 8 of the network apparatus 1 sequentially, the register 9 associated with the network controller 3 is adapted to determine the type of cable 7 and which has its connector 6 connected to the port 5 of the network apparatus 1, and it is determined whether one of the transmission interfaces 8 compatible with the cable 7 is connected to the cable 7 successfully.

While the invention herein disclosed has been described by means of specific embodiments, numerous modifications and variations could be made thereto by those skilled in the art without departing from the scope and spirit of the invention set forth in the claims.

What is claimed is:

1. An apparatus of supporting a plurality of cable types in compliance of standard protocols, comprising:
  a plurality of transmission interfaces, wherein each of said plurality of transmission interfaces supports one cable type;

a port configured to receive network signals transmitted from a cable, wherein said port connects to said cable via a connector;

a switch located between said port and said plurality of transmission interfaces, switching to transmit said network signals to one of said plurality of transmission interfaces;

a memory having an automatic detection program; and a network controller connected to said memory and said plurality of transmission interfaces, wherein said network controller executes said automatic detection program and determines whether said one of said transmission interfaces is adapted to receive and process said network signals based on said cable's cable type; wherein if said one of said transmission interfaces is adapted to receive and process said network signals from said cable's cable type, setting said switch to a first state enabling said one of said transmission interfaces to process said network signals; and if said one of said transmission interfaces is not adapted to receive and process said network signals from said cable's cable type, setting said switch to a second state to switch said network signals to another one of said transmission interfaces.

2. The apparatus of claim 1, said switch switching to transmit said network signals to different one of said transmission interfaces according to an order of said transmission interfaces predetermined by said automatic detection program.

3. The apparatus of claim 1, said network controller determines whether said one of said transmission interfaces is adapted to receive and process said network signals based on said cable's cable type within a predetermined time period.

4. The apparatus of claim 1, said cable's cable type is unshielded twisted pair.

5. The apparatus of claim 1, said port is RJ-45.

6. The apparatus of claim 1, said cable's cable type is BNC coaxial cable.

7. The apparatus of claim 1, said port is BNC connector.

8. The apparatus of claim 1, said cable's cable type is optical fiber.

9. The apparatus of claim 1, said port is optical fiber connector.

10. The apparatus of claim 1, said cable's cable type is thick coaxial cable.

11. The apparatus of claim 1, said port is AUI connector.

* * * * *